(12) United States Patent
Chen

(10) Patent No.: US 11,404,677 B2
(45) Date of Patent: Aug. 2, 2022

(54) DISPLAY PANEL COMPRISING THERMOELECTRIC NANOPARTICLES, MANUFACTURING METHOD THEREOF, AND DISPLAY DEVICE

(71) Applicant: TCL China Star Optoelectronics Technology Co., Ltd., Shenzhen (CN)

(72) Inventor: Yani Chen, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 241 days.

(21) Appl. No.: 16/753,776

(22) PCT Filed: Feb. 28, 2020

(86) PCT No.: PCT/CN2020/077207
§ 371 (c)(1),
(2) Date: Apr. 5, 2020

(87) PCT Pub. No.: WO2021/147137
PCT Pub. Date: Jul. 29, 2021

(65) Prior Publication Data
US 2021/0408434 A1 Dec. 30, 2021

(30) Foreign Application Priority Data

Jan. 20, 2020 (CN) .......................... 202010067351.X

(51) Int. Cl.
| | | |
|---|---|---|
| *H01L 29/08* | (2006.01) | |
| *H01L 51/52* | (2006.01) | |
| *H01L 51/50* | (2006.01) | |
| *H01L 51/56* | (2006.01) | |
| *H01L 27/32* | (2006.01) | |

(52) U.S. Cl.
CPC ........ *H01L 51/529* (2013.01); *H01L 51/5064* (2013.01); *H01L 51/56* (2013.01); *H01L 27/3244* (2013.01); *H01L 2251/301* (2013.01); *H01L 2251/5369* (2013.01)

(58) Field of Classification Search
CPC .................................................... H01L 51/529
See application file for complete search history.

(56) References Cited

U.S. PATENT DOCUMENTS

| | | | | |
|---|---|---|---|---|
| 6,366,016 | B1 * | 4/2002 | Sakaguchi | H01L 27/3211 428/917 |
| 2007/0170839 | A1 * | 7/2007 | Choi | H05B 33/04 313/500 |
| 2013/0240847 | A1 * | 9/2013 | Zakhidov | H01L 51/5296 977/842 |
| 2017/0186986 | A1 * | 6/2017 | Lee | H01L 51/5004 |
| 2018/0255620 | A1 * | 9/2018 | Mao | H01L 51/5221 |
| 2018/0366673 | A1 * | 12/2018 | Xie | H01L 51/5221 |
| 2019/0067620 | A1 * | 2/2019 | Ning | H01L 51/0048 |
| 2019/0115555 | A1 * | 4/2019 | He | H01L 51/5036 |
| 2019/0371994 | A1 * | 12/2019 | Kim | H01L 35/28 |
| 2020/0006615 | A1 * | 1/2020 | Nakaya | H01L 35/32 |

* cited by examiner

Primary Examiner — Caleb E Henry

(57) ABSTRACT

A display panel, a manufacturing method thereof, and a display device are provided. The display panel includes a base layer, an anode layer disposed on the base layer, a hole transport layer disposed on the anode layer, a thermoelectric nanoparticle layer disposed on the hole transport layer, an organic light-emitting layer disposed on the thermoelectric nanoparticle layer, an electron transport layer disposed on the organic light-emitting layer, and a cathode layer disposed on the electron transport layer.

17 Claims, 2 Drawing Sheets

DISPLAY PANEL COMPRISING THERMOELECTRIC NANOPARTICLES, MANUFACTURING METHOD THEREOF, AND DISPLAY DEVICE

RELATED APPLICATIONS

This application is a National Phase of PCT Patent Application No. PCT/CN2020/077207 having International filing date of Feb. 28, 2020, which claims the benefit of priority of Chinese Patent Application No. 202010067351.X filed on Jan. 20, 2020. The contents of the above applications are all incorporated by reference as if fully set forth herein in their entirety.

FIELD AND BACKGROUND OF THE INVENTION

The present application relates to the technical field of display panels, and in particular, to a display panel, a manufacturing method thereof, and a display device.

Current conventional organic light-emitting diode (OLED) structure has advantages of self-luminescence, wide viewing angles, high contrast, low power consumption, and extremely fast response times.

Please refer to FIG. 1, where FIG. 1 is a schematic structural diagram of an OLED display panel 100 in the conventional art. The display panel 100 includes a base layer 110, an anode layer 120 disposed on the base layer 110, a hole transport layer (HTL) 130 disposed on the anode layer 120, an organic light-emitting layer (EML) 150 disposed on the hole transport layer (HTL) 130, an electron transport layer (ETL) 160 disposed on the organic light-emitting layer 150, and a cathode layer 170 disposed on the electron transport layer (ETL) 160.

A light-emitting process of OLED display panels can be divided into: injection of electrons and holes, transportation of electrons and holes, recombination of electrons and holes, and de-excitation of excitons. Specifically, an external driving voltage is applied to the cathode layer and the anode layer, electrons and holes are injected from the cathode layer and the anode layer into the electron transport layer and the hole transport layer, respectively, then recombined into excitons in the light-emitting layer, and then emit visible light after being radiated.

However, the above-mentioned light-emitting process has the following two problems. First is a heat dissipation problem of the OLED display panels. Heat is mainly radiated by a thin film transistor (TFT) array substrate near a side of the base layer. Therefore, a direction of temperature gradient is a hot end and a cold end corresponding to the anode layer and the cathode layer, respectively. If heat cannot be dissipated in time, material of the organic light-emitting layer will be crystallized, which will reduce luminous efficiency and service life. Second, potential barriers of electrons and holes in a migration process will cause undesired carrier recombination and reduce a total number of carriers into the light-emitting layer, thereby lowering the luminous efficiency.

Therefore, it is necessary to develop a new type of display panel to overcome defects of the conventional art.

SUMMARY OF THE INVENTION

Technical Problem

An object of the present invention is to provide a display panel capable of solving the problem of poor heat dissipation of the display panels in the conventional art.

Technical Solutions

To achieve the above object, the present invention provides a display panel, including a base layer, an anode layer disposed on the base layer, a hole transport layer disposed on the anode layer, a thermoelectric nanoparticle layer disposed on the hole transport layer, an organic light-emitting layer is disposed on the thermoelectric nanoparticle layer, an electron transport layer disposed on the organic light-emitting layer, and a cathode layer disposed on the electron transport layer.

Meanwhile, the thermoelectric nanoparticle layer will absorb heat from the direction of the base layer to achieve the purpose of spontaneous heat dissipation; on the other hand, holes inside the thermoelectric nanoparticle layer will diffuse from a hot end to a cold end to form a built-in electric field. A direction of the built-in electric field is consistent with a direction of an electric field of the display panel in the operation, which helps holes from the hole transport layer to cross the potential barrier to diffuse into the organic light-emitting layer, thereby improving the luminous efficiency.

Furthermore, in other embodiments, the thermoelectric nanoparticle layer is made of P-type thermoelectric nanoparticles.

Furthermore, in other embodiments, the P-type thermoelectric nanoparticles include bismuth telluride and/or a germanium-silicon alloy.

Furthermore, in other embodiments, a direction of a built-in electric field of the thermoelectric nanoparticle layer is same as a direction of an electric field of the display panel.

Furthermore, in other embodiments, a thickness of the thermoelectric nanoparticle layer ranges from 10 nm to 500 nm.

Furthermore, in other embodiments, thermal conductivity of the thermoelectric nanoparticle layer ranges from 2.4 W/MK to 3.3 W/MK.

Furthermore, in other embodiments, the display panel further including an array substrate disposed on a side of the base layer away from the anode layer, wherein the array substrate includes: a substrate layer; an active layer disposed on the substrate layer; a gate insulation layer disposed on the active layer; a gate layer disposed on the gate insulation layer; an interlayer dielectric layer disposed on the gate layer; a source-drain layer disposed on the interlayer dielectric layer; and a pixel definition layer disposed on the source-drain layer.

To achieve the above object, the present invention further provides a method for manufacturing a display panel according to the present invention. The method includes following steps: providing a base layer; fabricating an anode layer on the base layer; fabricating a hole transport layer on the anode layer; fabricating a thermoelectric nanoparticle layer on the hole transport layer; fabricating an organic light-emitting layer on the thermoelectric nanoparticle layer; fabricating an electron transport layer on the organic light-emitting layer; and fabricating a cathode layer on the electron transport layer.

Furthermore, in other embodiments, the thermoelectric nanoparticle layer is fabricated by a spin coating method or a thermal evaporation method.

To achieve the above object, the present invention further provides a display device including the display panel according to the present invention.

Beneficial Effect

Compared with the conventional art, the present invention has the beneficial effect that the present invention provides a display panel, a method for manufacturing the same, and a display device. The thermoelectric nanoparticle layer is disposed between the hole transport layer and the organic light-emitting layer, and the thermoelectric nanoparticle layer is made of P-type thermoelectric nanoparticles, such as bismuth telluride and/or a germanium-silicon alloy. On the one hand, the thermoelectric nanoparticle layer will absorb the heat from the direction of the base layer to achieve the purpose of spontaneous heat dissipation; on the other hand, the holes inside the thermoelectric nanoparticle layer will diffuse from the hot end to the cold end to form a built-in electric field. A direction of the built-in electric field is consistent with a direction of an electric field of the display panel in the operation, which helps holes from the hole transport layer to cross the potential barrier to diffuse into the organic light-emitting layer, improving the hole injection efficiency, and thereby improving the luminous efficiency of the display panel.

BRIEF DESCRIPTION OF THE SEVERAL VIEW OF THE DRAWINGS

The following detailed description of specific embodiments of the present application will make the technical solutions and other beneficial effects of the present application obvious in conjunction with the accompanying drawings.

Figure 1:
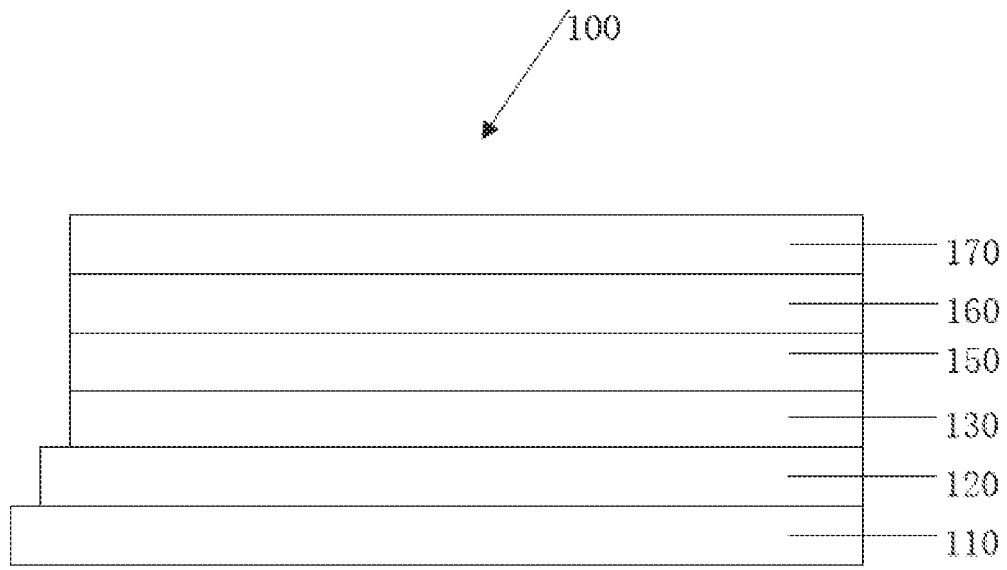
FIG. 1 is a schematic structural diagram of a display panel provided in the conventional art.

DESCRIPTION OF THE DRAWINGS IN THE BACKGROUND display panel, 100; base layer, 110;
anode layer, 120; hole transport layer, 130;
organic light-emitting layer, 150;
electron transport layer, 160; and
cathode layer, 170.

DESCRIPTION OF THE DRAWINGS IN THE EMBODIMENTS OF THE PRESENT INVENTION display panel, 100; base layer, 110;
anode layer, 120; hole transport layer, 130;
thermoelectric nanoparticle layer, 140; organic light-emitting layer, 150;
electron transport layer, 160; and
cathode layer, 170.

DESCRIPTION OF SPECIFIC EMBODIMENTS OF THE INVENTION

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention.

In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the description of this application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in this application can be understood according to specific situations.

Figure 2:
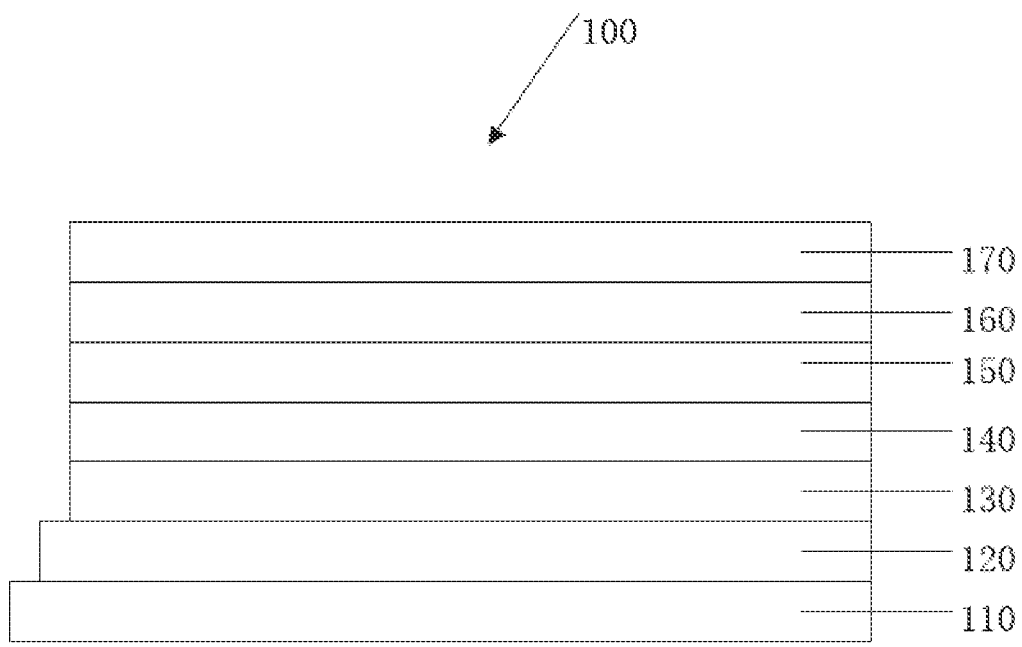
FIG. 2 is a schematic structural diagram of a display panel according to an embodiment of the present invention.

Specifically, please refer to FIG. 2, FIG. 2 is a schematic structural diagram of a display panel 100 according to the present embodiment. The display panel 100 includes a base layer 110, an anode layer 120, a hole transport layer 130, a thermoelectric nanoparticle layer 140, an organic light-emitting layer 150, an electron transport layer 160, and a cathode layer 170.

The anode layer 120 is disposed on the base layer 110, the hole transport layer 130 is disposed on the anode layer 120, the thermoelectric nanoparticle layer 140 is disposed on the hole transport layer 130, the organic light-emitting layer 150 is disposed on the thermoelectric nanoparticle layer 140, the electron transport layer 160 is disposed on the organic light-emitting layer 150, and the cathode layer 170 is disposed on the electron transport layer 160.

An array substrate is further disposed on a side of the base layer 110 away from the anode layer 120. The array substrate includes a substrate layer, an active layer disposed on the substrate layer, a gate insulation layer disposed on the active layer, a gate layer disposed on the gate insulation layer, an interlayer dielectric layer disposed on the gate layer, a source-drain layer disposed on the interlayer dielectric layer, and a pixel definition layer disposed on the source-drain layer. Since the improvement of the present invention lies in the thermoelectric nanoparticle layer 140, the array substrate will not be described in detail one by one.

A light-emitting process of display panels can be divided into: injection of electrons and holes, transportation of electrons and holes, recombination of electrons and holes, and de-excitation of excitons. Specifically, an external driving voltage is applied to the cathode layer and the anode layer, electrons and holes are injected from the cathode layer and the anode layer into the electron transport layer and the hole transport layer, respectively, then recombined into excitons in the light-emitting layer, and then emit visible light after being radiated.

Heat is mainly radiated by the array substrate near a side of the base layer. Therefore, a direction of temperature gradient is a hot end and a cold end corresponding to the anode layer and cathode layer, respectively. If heat cannot be dissipated in time, material of the organic light-emitting layer will be crystallized, which will reduce luminous efficiency and service life.

The thermoelectric nanoparticle layer 140 in the present embodiment will absorb heat from a direction of the base layer to achieve a purpose of spontaneous heat dissipation.

In the present embodiment, the thermoelectric nanoparticle layer 140 is made of P-type thermoelectric nanoparticles. The P-type thermoelectric nanoparticles include bismuth telluride and/or a germanium-silicon alloy. A thickness of the thermoelectric nanoparticle layer 140 ranges from 10 nm to 500 nm. A thermal conductivity ranges from 2.4 W/MK to 3.3 W/MK.

In addition, in the above-mentioned light-emitting process, potential barriers of electrons and holes in a migration process will cause undesired carrier recombination and reduce a total number of carriers into the light-emitting layer, thereby lowering the luminous efficiency.

A direction of a built-in electric field of the thermoelectric nanoparticle layer 140 according to the present embodiment is same as a direction of an electric field of the display panel 100. Holes inside the thermoelectric nanoparticle layer 140 will diffuse from the hot end to the cold end to form the built-in electric field. The direction of the built-in electric field is consistent with the direction of the electric field of the display panel 100 in the operation, which helps holes from the hole transport layer to cross the potential barrier to diffuse into the organic light-emitting layer, thereby improving the luminous efficiency.

In the display panel 100 according to the present embodiment, the thermoelectric nanoparticle layer 140 is disposed between the hole transport layer 130 and the organic light-emitting layer 150. The thermoelectric nanoparticle layer 140 is made of P-type thermoelectric nanoparticles, such as bismuth telluride and/or germanium-silicon alloy. On the one hand, the thermoelectric nanoparticle layer 140 will absorb heat from the direction of the base layer to achieve the purpose of spontaneous heat dissipation; on the other hand, the holes inside the thermoelectric nanoparticle layer 140 will diffuse from the hot end to the cold end to form the built-in electric field. The direction of the built-in electric field is same as the direction of the electric field when the display panel 100 is in operation, which helps holes from the hole transport layer 130 to cross the potential barrier to diffuse to the organic light-emitting layer 150, improving the hole injection efficiency, and thereby improving the luminous efficiency of the display panel 100.

Figure 3:
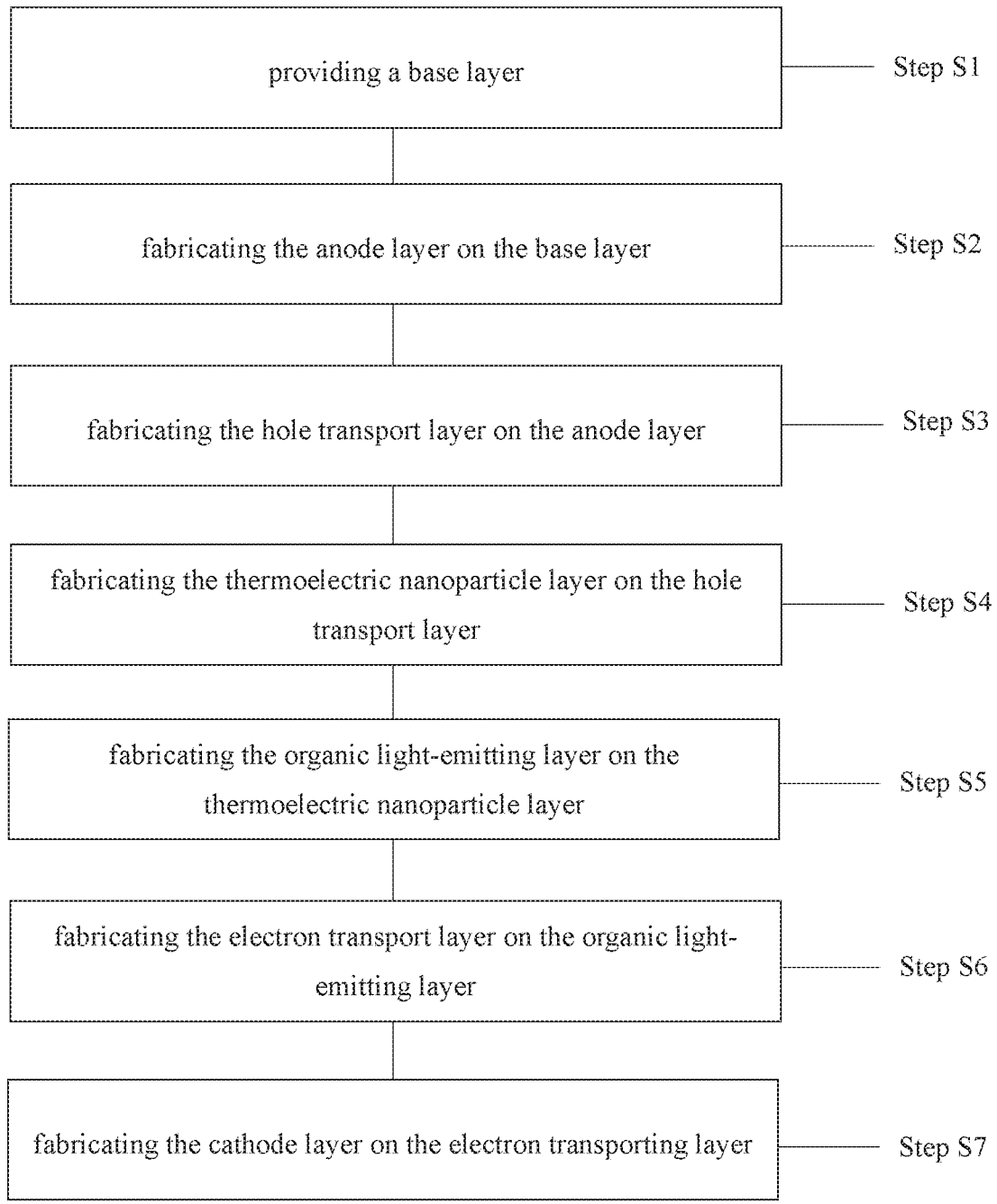
FIG. 3 is a flowchart of a method for manufacturing a display panel according to an embodiment of the present invention.

An embodiment of the present invention further provides a method for manufacturing the display panel 100. The manufacturing method includes steps S1 to S7. Please refer to FIG. 3, which is a flowchart of the method for manufacturing the display panel 100 according to the present embodiment.

Step S1: providing a base layer 110.

Step S2: fabricating the anode layer 120 on the base layer 110.

Step S3: fabricating the hole transport layer 130 on the anode layer 120.

Step S4: fabricating the thermoelectric nanoparticle layer 140 on the hole transport layer 130. The thermoelectric nanoparticle layer 140 is fabricated by a spin coating method or a thermal evaporation method.

The thermoelectric nanoparticle layer 140 is made of P-type thermoelectric nanoparticles. The P-type thermoelectric nanoparticles include bismuth telluride and/or the germanium-silicon alloy. The thickness of the thermoelectric nanoparticle layer 140 ranges from 10 nm to 500 nm. The thermal conductivity ranges from 2.4 W/MK to 3.3 W/MK.

Step S5: fabricating the organic light-emitting layer 150 on the thermoelectric nanoparticle layer 140.

Step S6: fabricating the electron transport layer 160 on the organic light-emitting layer 150.

Step S7: fabricating the cathode layer 170 on the electron transporting layer 160.

In order to achieve the above object, the present invention further provides a display device including the display panel 100 according to the present invention.

The beneficial effect of the present invention is that the present invention provides the display panel 100, the method for manufacturing the same, and the display device. The thermoelectric nanoparticle layer 140 is disposed between the hole transport layer 130 and the organic light-emitting layer 150, and the thermoelectric nanoparticle layer is made of P-type thermoelectric nanoparticles, such as bismuth telluride and/or a germanium-silicon alloy. On the one hand, the thermoelectric nanoparticle layer 140 will absorb the heat from the direction of the base layer to achieve the purpose of spontaneous heat dissipation; on the other hand, the holes inside the thermoelectric nanoparticle layer 140 will diffuse from the hot end to the cold end to form the built-in electric field. The direction of the built-in electric field is consistent with the direction of the electric field of the display panel in the operation, which helps holes from the hole transport layer 130 to cross the potential barrier to diffuse into the organic light-emitting layer 150, improving the hole injection efficiency, and thereby improving the luminous efficiency of the display panels.

In the above embodiments, the description of each embodiment has its own emphasis. For a part that is not described in detail in an embodiment, reference can be made to related descriptions in other embodiments.

The display panel, the manufacturing method thereof, and the display device provided in the embodiments of the present application have been described in detail above. Specific embodiments have been used in this document to explain the principle and implementation of the present application. The descriptions of the above embodiments are only used to help understand the technical solution of this application and its core ideas. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising:
   a base layer;
   an anode layer disposed on the base layer;
   a hole transport layer disposed on the anode layer;
   a thermoelectric nanoparticle layer disposed on the hole transport layer, wherein the thermoelectric nanoparticle layer is made of P-type thermoelectric nanoparticles;
   an organic light-emitting layer disposed on the thermoelectric nanoparticle layer;
   an electron transport layer disposed on the organic light-emitting layer; and
   a cathode layer disposed on the electron transport layer.

2. The display panel of claim 1, wherein the P-type thermoelectric nanoparticles comprise bismuth telluride and/or a germanium-silicon alloy.

3. The display panel of claim 1, wherein a direction of a built-in electric field of the thermoelectric nanoparticle layer is same as a direction of an electric field of the display panel.

4. A display device, comprising the display panel of claim 1.

5. The display panel of claim 1, wherein a thickness of the thermoelectric nanoparticle layer ranges from 10 nm to 500 nm.

6. The display panel of claim 1, wherein thermal conductivity of the thermoelectric nanoparticle layer ranges from 2.4 W/MK to 3.3 W/MK.

7. The display panel of claim 1, further comprising an array substrate disposed on a side of the base layer away from the anode layer, wherein the array substrate comprises:
   a substrate layer;
   an active layer disposed on the substrate layer;
   a gate insulation layer disposed on the active layer;
   a gate layer disposed on the gate insulation layer;
   an interlayer dielectric layer disposed on the gate layer;
   a source-drain layer disposed on the interlayer dielectric layer; and
   a pixel definition layer disposed on the source-drain layer.

8. A method for manufacturing the display panel of claim 1, comprising following steps:
   providing a base layer;
   fabricating an anode layer on the base layer;
   fabricating a hole transport layer on the anode layer;
   fabricating a thermoelectric nanoparticle layer on the hole transport layer, wherein the thermoelectric nanoparticle layer is made of P-type thermoelectric nanoparticles;
   fabricating an organic light-emitting layer on the thermoelectric nanoparticle layer;
   fabricating an electron transport layer on the organic light-emitting layer; and
   fabricating a cathode layer on the electron transport layer.

9. The method of claim 8, wherein the thermoelectric nanoparticle layer is fabricated by a spin coating method or a thermal evaporation method.

10. The method of claim 8, wherein a direction of a built-in electric field of the thermoelectric nanoparticle layer is same as a direction of an electric field of the display panel.

11. The method of claim 8, wherein a thickness of the thermoelectric nanoparticle layer ranges from 10 nm to 500 nm.

12. The method of claim 8, wherein thermal conductivity of the thermoelectric nanoparticle layer ranges from 2.4 W/MK to 3.3 W/MK.

13. The display device of claim 4, wherein the P-type thermoelectric nanoparticles comprise bismuth telluride and/or a germanium-silicon alloy.

14. The display device of claim 4, wherein a direction of a built-in electric field of the thermoelectric nanoparticle layer is same as a direction of an electric field of the display panel.

15. The display device of claim 4, wherein a thickness of the thermoelectric nanoparticle layer ranges from 10 nm to 500 nm.

16. The display device of claim 4, wherein thermal conductivity of the thermoelectric nanoparticle layer ranges from 2.4 W/MK to 3.3 W/MK.

17. The display device of claim 4, further comprising an array substrate disposed on a side of the base layer away from the anode layer, wherein the array substrate comprises:
   a substrate layer;
   an active layer disposed on the substrate layer;
   a gate insulation layer disposed on the active layer;
   a gate layer disposed on the gate insulation layer;
   an interlayer dielectric layer disposed on the gate layer;
   a source-drain layer disposed on the interlayer dielectric layer; and
   a pixel definition layer disposed on the source-drain layer.

* * * * *